(12) United States Patent
Bai

(10) Patent No.: US 10,476,035 B2
(45) Date of Patent: Nov. 12, 2019

(54) FLEXIBLE DISPLAY APPARATUS

(71) Applicant: WUHAN CHINA STAR OPTOELECTRONICS SEMICONDUCTOR DISPLAY TECHNOLOGY CO., LTD., Wuhan, Hubei (CN)

(72) Inventor: Dan Bai, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/742,912

(22) PCT Filed: Jan. 4, 2018

(86) PCT No.: PCT/CN2018/071240
§ 371 (c)(1),
(2) Date: Jan. 9, 2018

(87) PCT Pub. No.: WO2019/109444
PCT Pub. Date: Jun. 13, 2019

(65) Prior Publication Data
US 2019/0173056 A1 Jun. 6, 2019

(30) Foreign Application Priority Data
Dec. 6, 2017 (CN) .......................... 2017 1 1272685

(51) Int. Cl.
*H01L 33/00* (2010.01)
*H01L 21/00* (2006.01)
*H01L 51/52* (2006.01)
*H01L 27/32* (2006.01)
*H01L 51/00* (2006.01)
(Continued)

(52) U.S. Cl.
CPC .......... *H01L 51/5268* (2013.01); *G06F 3/044* (2013.01); *G06F 3/0412* (2013.01); *G06F 3/0445* (2019.05); *H01L 27/323* (2013.01); *H01L 27/3244* (2013.01); *H01L 51/0097* (2013.01); *H01L 51/5253* (2013.01); *G06F 2203/04102* (2013.01); *H01L 2251/303* (2013.01); *H01L 2251/5338* (2013.01); *H01L 2251/5369* (2013.01)

(58) Field of Classification Search
CPC .................................................. H01L 51/3275
USPC ................... 438/29, 31, 46; 257/40, 98, 103
See application file for complete search history.

(56) References Cited

U.S. PATENT DOCUMENTS 9,202,855 B1 * 12/2015 Jo ........................ H01L 27/3211
10,079,367 B2 * 9/2018 Li ........................ H01L 51/5281
(Continued)

*Primary Examiner* — Calvin Lee
(74) *Attorney, Agent, or Firm* — Soroker Agmon Nordman

(57) ABSTRACT

A flexible display apparatus is provided in the present disclosure and includes a flexible substrate, an organic electroluminescent device, and a plurality of thin film transistors disposed between the flexible substrate and the organic electroluminescent device. The organic electroluminescent device is controlled by the thin film transistors to emit light. The flexible substrate is doped with a plurality of nano-particles that are configured to refract the light emitted from the organic light-emitting layer to an external environment.

7 Claims, 2 Drawing Sheets

(51) Int. Cl.
    *G06F 3/044*     (2006.01)
    *G06F 3/041*     (2006.01)

(56) References Cited

U.S. PATENT DOCUMENTS

2017/0358763 A1\* 12/2017 Chung .................. C23C 14/086
2018/0287080 A1\* 10/2018 Wang .................. H01L 51/0097

\* cited by examiner

FLEXIBLE DISPLAY APPARATUS

FIELD OF DISCLOSURE

The present disclosure relates to a technical field of displays, and particularly to a flexible display apparatus.

BACKGROUND OF DISCLOSURE

Organic light emitting display (OLED) display technology is different from traditional liquid crystal display (LCD) display technology, such as no backlight is required, and an organic material coating layer and and a glass substrate are both very thin. Organic material will emit light when current flows through it. OLED display screens can be made lighter and thinner with a wider viewing angle, and are able to significantly save energy. Therefore, it is recognized as the most promising display apparatus in industry.

Light generated in flexible OLEDs with light emitting from double-sides will be reflected and refracted due to different optical coefficients of materials such as a flexible substrate and a display screen in the flexible OLEDs. Optical radiation of the flexible OLED can be divided into three modes: an external mode, which is used to transport the optical radiation into the air; a waveguide mode, which is limited to organic objects; and a plasma mode limited to an interface between a metal material and a dielectric material. The flexible OLEDs with light emitting from double-sides of the prior art have problems such as a higher proportion of the light from the waveguide mode and the plasma mode and a lower proportion of the external mode to cause that a light extraction rate is too low.

SUMMARY OF DISCLOSURE

An object of the present disclosure is to provide a flexible display apparatus that can increase a light extraction efficiency.

A flexible display apparatus is provided by an embodiment of the present disclosure and includes a flexible substrate, an organic electroluminescent device, and a plurality of thin film transistors disposed between the flexible substrate and the organic electroluminescent device;

wherein the organic electroluminescent device comprises a first electrode, a second electrode both disposed on the thin film transistors, and an organic light emitting layer disposed between the first electrode and the second electrode, wherein the first electrode and the second electrode are controlled by the thin film transistors to cause the organic light emitting layer to emit light;

wherein the flexible substrate is doped with a plurality of nano-particles that are configured to refract the light emitted from the organic light-emitting layer to an external environment; and wherein each of the nano-particles has a diameter from 200 to 400 nanometers and the nano-particles comprise titanium dioxide nano-particles.

In some embodiments, material of the flexible substrate include polyimide material, a mass fraction of the nano-particles in the polyimide material is 5%.

In some embodiments, the nano-particles are dissolved in the polyimide material with toluene as a solvent.

In some embodiments, the nano-particles are uniformly distributed in the flexible substrate.

In some embodiments, the flexible display apparatus further includes a thin film packaging layer and a display screen, the display screen includes an organic photoresist layer;

wherein the thin film packaging layer is disposed on the second electrode; and wherein the organic photoresist layer is disposed on the thin film packaging layer and doped with the nano-particles to refract the light emitted from the organic light-emitting layer to the external environment.

In some embodiments, material of the organic photoresist layer include organic photoresist material, a mass fraction of the nano-particles in the organic photoresist material is 5%.

In some embodiments, the nano-particles are dissolved in the organic photoresist material with toluene as a solvent.

In some embodiments, the nano-particles are uniformly distributed in the organic photoresist layer.

In some embodiments, the display screen further includes a capacitive layer, the capacitive layer is disposed between the thin film packaging layer and the organic photoresist layer.

Another flexible display apparatus is provided by an embodiment of the present disclosure and includes a flexible substrate, an organic electroluminescent device, and a plurality of thin film transistors disposed between the flexible substrate and the organic electroluminescent device;

wherein the organic electroluminescent device comprises a first electrode, a second electrode both disposed on the thin film transistors, and an organic light emitting layer disposed between the first electrode and the second electrode, wherein the first electrode and the second electrode are controlled by the thin film transistors to cause the organic light emitting layer to emit light; and wherein the flexible substrate is doped with a plurality of nano-particles that are configured to refract the light emitted from the organic light-emitting layer to an external environment.

In some embodiments, the nano-particles includes titanium dioxide nano-particles.

In some embodiments, material of the flexible substrate include polyimide material, a mass fraction of the nano-particles in the polyimide material is 5%.

In some embodiments, the nano-particles are dissolved in the polyimide material with toluene as a solvent.

In some embodiments, each of the nano-particles has a diameter from 200 to 400 nanometers.

In some embodiments, the nano-particles are uniformly distributed in the flexible substrate.

In some embodiments, the flexible display apparatus further includes a thin film packaging layer and a display screen, the display screen comprising an organic photoresist layer;

wherein the thin film packaging layer is disposed on the second electrode; and wherein the organic photoresist layer is disposed on the thin film packaging layer and doped with the nano-particles to refract the light emitted from the organic light-emitting layer to the external environment.

In some embodiments, material of the organic photoresist layer includes organic photoresist material, a mass fraction of the nano-particles in the organic photoresist material is 5%.

In some embodiments, the nano-particles are dissolved in the organic photoresist material with toluene as a solvent.

In some embodiments, the nano-particles are uniformly distributed in the organic photoresist layer.

In some embodiments, the display screen further includes a capacitive layer, the capacitive layer is disposed between the thin film packaging layer and the organic photoresist layer.

Compared with the flexible display apparatus in the prior art, the flexible display apparatus of the present disclosure is achieved to increase the light extraction efficiency of the organic light emitting layer by adding the nano-particles in the flexible substrate.

In order to make the above contents of the present disclosure more comprehensible and understandable, the preferred embodiments are described below in detail with reference to the accompanying drawings.

DETAILED DESCRIPTION OF PREFERRED EMBODIMENTS

Figure 1:
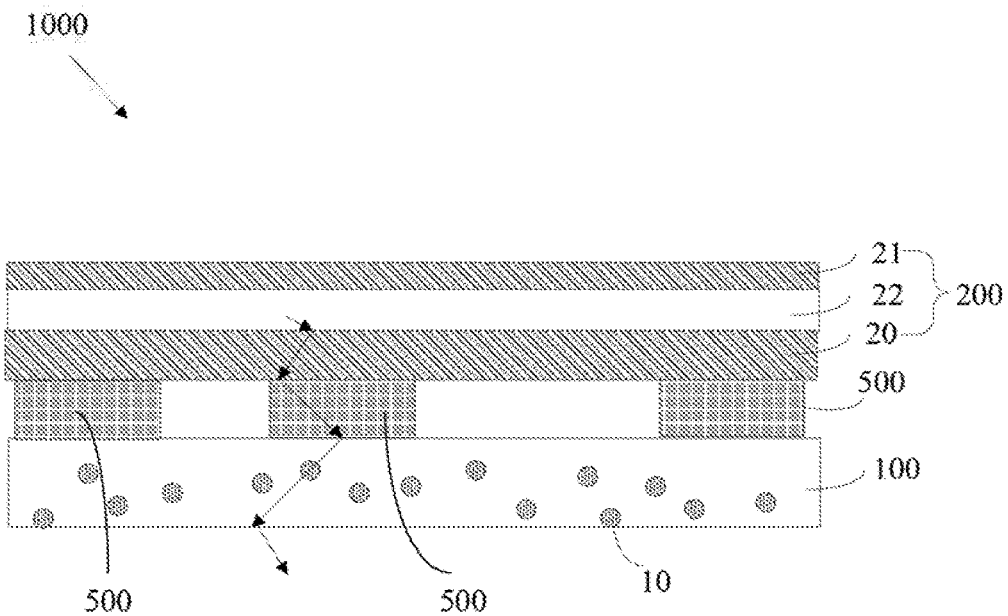
FIG. 1 is a schematic structure diagram of a flexible display apparatus provided by an embodiment of the present disclosure.

The following description of each embodiment refers to the appended drawings for illustrating specific embodiments in which the present disclosure may be practiced. Directional terms as mentioned in the present disclosure, such as "up", "down", "front", "post", "left", "right", "inside", "outside", "lateral", etc., are merely used for the purpose of illustrating and understanding the present disclosure and are not intended to be limiting of the present disclosure.

In the drawings, units with similar structures are denoted by the same reference numerals.

Referring herein to "an embodiment" means that a particular feature, structure, or characteristic described in connection with the embodiment may be included in at least one embodiment of the disclosure. The appearances of the phrase in various places in the specification are not necessarily all referring to the same embodiment, nor are separate or alternative embodiments mutually exclusive of other embodiments. The explicit and implicit understanding to a person having ordinary skill in the art is that the embodiments described herein may be combined with other embodiments.

Please refer to FIG. 1, which is a schematic structure diagram of a flexible display apparatus provided by an embodiment of the present disclosure. The flexible display apparatus 1000 includes a flexible substrate 100, an organic electroluminescent device 200, and a plurality of thin film transistors 500 disposed between the flexible substrate and the organic electroluminescent device.

As shown in FIG. 1, the organic electroluminescent device 200 is formed in a sandwiched structure and includes a first electrode 20, a second electrode 21 both disposed on the thin film transistors 500, and an organic light emitting layer 22 disposed between the first electrode 20 and the second electrode 21. The first electrode 20 is an anode, which is specifically made of indium tin oxide material. The organic light emitting layer 22 consists of a single layer or a plurality of layers of light emitting material, specifically, it may be prepared by an evaporation method or a spin coating method. The second electrode 21 is a cathode, which may be prepared by using metal materials with low work function such as magnesium, calcium, and the like.

The flexible substrate 100 mainly consists of a polyester film with good light transmission performance, such as polyimide (PI) material, a metal foil, an ultra-thin glass, etc., which are doped with a plurality of nano-particles 10. The nano-particles 10 are configured to refract the light emitted from the organic light-emitting layer 22 to an external environment.

In some embodiments, material of the flexible substrate 100 include polyimide material, the nano-particles as a doping material are doped into the PI with a mass fraction of 5%. Each of the nano-particles 10 has a diameter from 200 to 400 nanometers. The nano-particles 10 include one or more of nano-particles such as titanium dioxide, $Fe_4O_3$, and zinc oxide.

In order to allow the flexible substrate 100 to transmit light uniformly, in this embodiment, the nano-particles 10 are uniformly distributed in the flexible substrate 100. Because of small diameter, high surface energy, and the tendency of spontaneous agglomeration of the nano-particles 10, which need to improve the dispersion and the stability in a liquid medium. Specifically, methods of physical dispersion such as ultrasonic dispersion, mechanical dispersion, and the like may be used, for example, the nano-particles in the media are fully dispersed by using external impact force. In addition, the nano-particles are further dispersed by using chemical methods, for example, the nano-particles are dispersed by using dispersants such as surfactants, inorganic polymers, coupling agents, and the like.

For example, the PI flexible substrate doped with the nano-particles, may use a glass as a substrate to coat the PI on the substrate, then, the nano-particles are dissolved in toluene for falling into the PI and mixed well, so as to make the nano-particles uniformly distributed in the flexible substrate.

When the organic light-emitting layer 22 emits light, the light will pass through the first electrode 20, the thin film transistors 500, and the flexible substrate 100 in sequence. First, the light is refracted from the thin film transistors 500 to the flexible substrate 100, and then is refracted from the nano-particles 10 in the flexible substrate 100 to the external environment. Thus, the light is scattered out more, and the light extraction efficiency of the organic light emitting layer 22 is further improved.

Figure 2:
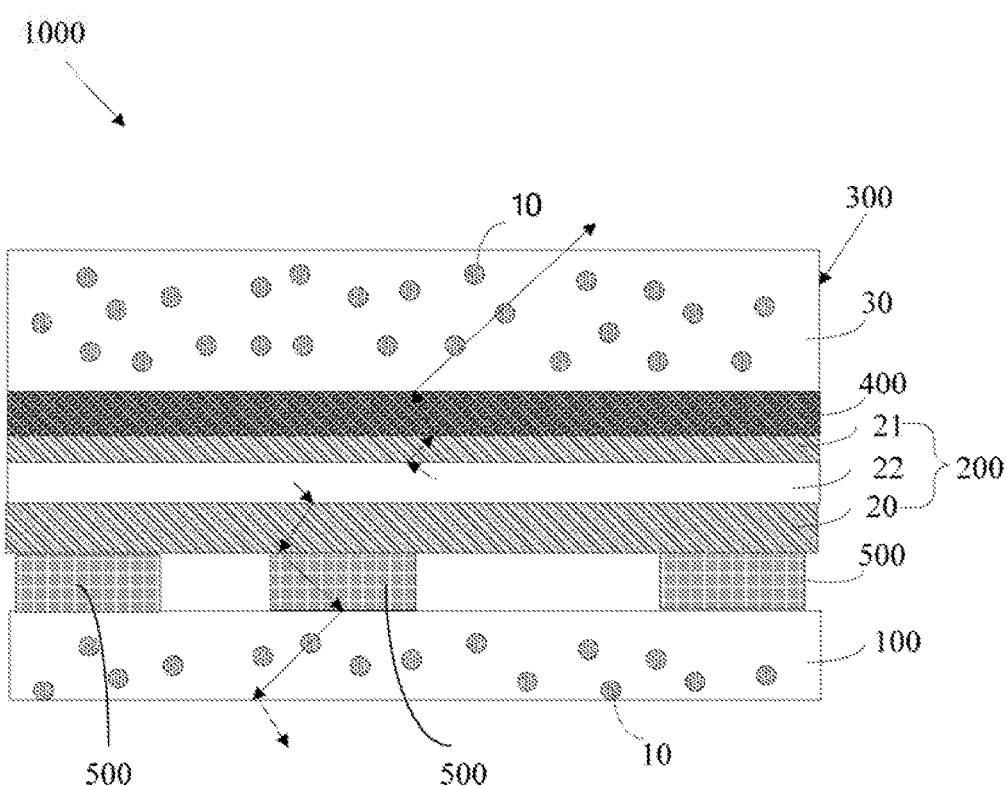
FIG. 2 is a schematic structure diagram of another flexible display apparatus provided by an embodiment of the present disclosure.

In some embodiments, as shown in FIG. 2, the flexible display apparatus 1000 further includes a thin film packaging layer 400 and a display screen 300, the display screen 300 includes an organic photoresist layer 30.

Because the second electrode 21 is generally made of active metal such as aluminum, magnesium, calcium, and the like, which is very easy to react with the water vapor infiltrated by the external environment and affects an injection of the electric charge. Meanwhile, the infiltrated water and oxygen also chemically react with the organic material in the organic light-emitting layer 22, causing the performance of the organic electroluminescent device 200 to be degraded. Therefore, as shown in FIG. 2, the thin film packaging layer 400 is disposed in the flexible display apparatus 1000 by using thin film packaging technology, and is configured to protect the organic light-emitting layer 22 from external moisture, oxygen erosion, to serve as a packaging.

In some embodiments, the organic photoresist layer 30 is disposed on the thin film packaging layer 400 and consists of an organic photoresist (PR) material. The nano-particles 10 as a doping material are doped into the organic PR material with a mass fraction of 5%. Specifically, first, the nano-particles are dissolved in toluene, and then to be dissolved into the organic PR material and mixed well, so as to make the nano-particles uniformly distributed in the organic PR material. Each of the nano-particles 10 has a diameter from 200 to 400 nanometers. The nano-particles 10 include one or more of nano-particles such as titanium dioxide, $Fe_4O_3$, and zinc oxide.

In order to uniformly distribute the nano-particles 10 in the organic PR material. Specifically, methods of physical dispersion such as ultrasonic dispersion, mechanical dispersion, and the like may be used, for example, the nano-particles in the media are fully dispersed by using external impact force. In addition, the nano-particles are further dispersed by using chemical methods, for example, the nano-particles are dispersed by using dispersants such as surfactants, inorganic polymers, coupling agents, and the like.

When the organic light-emitting layer 22 emits light, the light will pass through the second electrode layer 21, the thin film packaging layer 400, and the organic photoresist layer 30 in sequence. First, the light is refracted from the thin film packaging layer 400 to the organic photoresist layer 30, and then is refracted from the nano-particles 10 in the organic photoresist layer 30 to the external environment. Thus, the light is scattered out more, and the light extraction efficiency along a direction from the organic light emitting layer to the display screen 300 is further improved from 40 to 60%.

Figure 3:
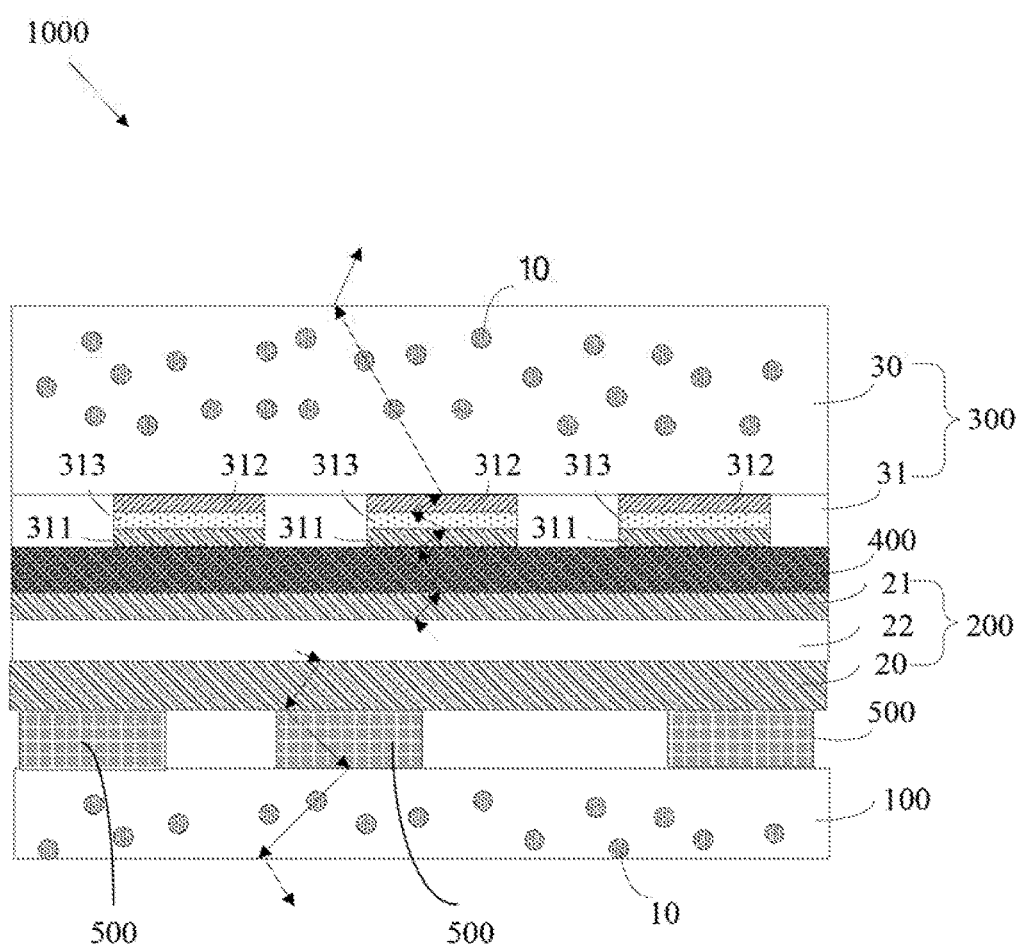
FIG. 3 is another schematic structure diagram of another flexible display apparatus provided by an embodiment of the present disclosure.

In some embodiments, the display screen 300 is a touch screen. Please refer to FIG. 3, the display screen 300 further includes a capacitive layer 31, which is disposed between the thin film packaging layer 400 and the organic photoresist layer 30 for detecting a touch capacitance. The capacitive layer 31 includes a first metal layer 311, a second metal layer 312 both disposed on the thin film packaging layer 400, and an insulating layer 313 located between the first metal layer 311 and the second metal layer 312. The first metal layer 311 and the second metal layer 312 are made of titanium/aluminum/titanium. The insulating layer 313 is made of silicon nitride. When the display screen 300 is pressed, a capacitance is formed between the first metal layer 311 and the second metal layer 312.

When the organic light-emitting layer 22 emits light to the display screen 300, the light will pass through the second electrode layer 21, the thin film packaging layer 400, the capacitive layer 31, and the organic photoresist layer 30 in sequence. First, the light is refracted from the thin film packaging layer 400 through the capacitive layer 31 to the organic photoresist layer 30, and then is refracted from the nano-particles 10 in the organic photoresist layer 30 to the external environment. Thus, the light is scattered out more, and the light extraction efficiency along a direction from the organic light emitting layer to the display screen 300 is further improved from 40 to 60%.

The flexible display apparatus of the present disclosure is achieved to increase the light extraction efficiency of the organic light emitting layer by adding the nano-particles in the flexible substrate. In addition, the light extraction efficiency from the organic light emitting layer is further increased by adding the nano-particles in the organic photoresist layer.

While the present disclosure has been disclosed with reference to preferred embodiments, the above-described embodiments are not intended to limit the present disclosure, and a person having ordinary skill in the art will be able to make various changes and modifications without departing from the spirit and scope of the present disclosure, and thus the scope of the present disclosure is defined by the scope of the claims.

What is claimed is:

1. A flexible display apparatus, comprising:
   a flexible substrate doped with uniformly distributed first nano-particles, an organic electroluminescent device, and a plurality of thin film transistors disposed between the flexible substrate and the organic electroluminescent device;
   a thin film packaging layer and an organic photoresist layer disposed on the thin film packaging layer, the organic photoresist layer consisting of a material doped with uniformly distributed second nano-particles;
   a display screen comprising the organic photoresist layer;
   wherein the organic electroluminescent device comprises a first electrode and a second electrode both disposed on the thin film transistors, and an organic light emitting layer disposed between the first electrode and the second electrode, wherein the thin film transistors control the first electrode and the second electrode to cause the organic light emitting, layer to emit light;
   wherein an arrangement of the first electrode, the thin film transistors, and the flexible substrate is structured and configured together such that first light emitted from the organic light emitting layer is first refracted by the first electrode, then refracted from the thin film transistors, and then refracted from the uniformly distributed first nano-particles to an external environment; and
   wherein an arrangement of the second electrode, the thin film packaging layer, and the organic photoresist layer are structured and configured together such that second light emitted from the organic light emitting layer is first refracted by the second electrode, then refracted by the thin film packaging layer, and then refracted from the uniformly distributed second nano-particles to the display screen externally.

2. The flexible display apparatus as claimed in claim 1, wherein each of the nano-particles has a diameter from 200 to 400 nanometers.

3. The flexible display apparatus as claimed in claim 1, wherein the nano-particles comprise titanium dioxide nano-particles.

4. The flexible display apparatus as claimed in claim 1, wherein material of the flexible substrate comprise polyimide material, a mass fraction of the nano-particles in the polyimide material is 5%.

5. The flexible display apparatus as claimed in claim 4, wherein the nano-particles are dissolved in the polyimide material with toluene as a solvent.

6. The flexible display apparatus as claimed in claim 1, wherein the thin film packaging layer is disposed on the second electrode.

7. The flexible display apparatus as claimed in claim 1, wherein the display screen further comprises a capacitive layer, the capacitive layer is disposed between the thin film packaging layer and the organic photoresist layer.

* * * * *